Jan. 23, 1968 P. O. HARVEY 3,365,585
VOLTAGE DOUBLER CIRCUIT INCLUDING TRANSISTOR WHOSE SEMICONDUCTOR JUNCTIONS REPLACE SECOND DIODE AND WHICH CIRCUITS PROVIDES PULSE STRETCHING
Filed Oct. 21, 1965
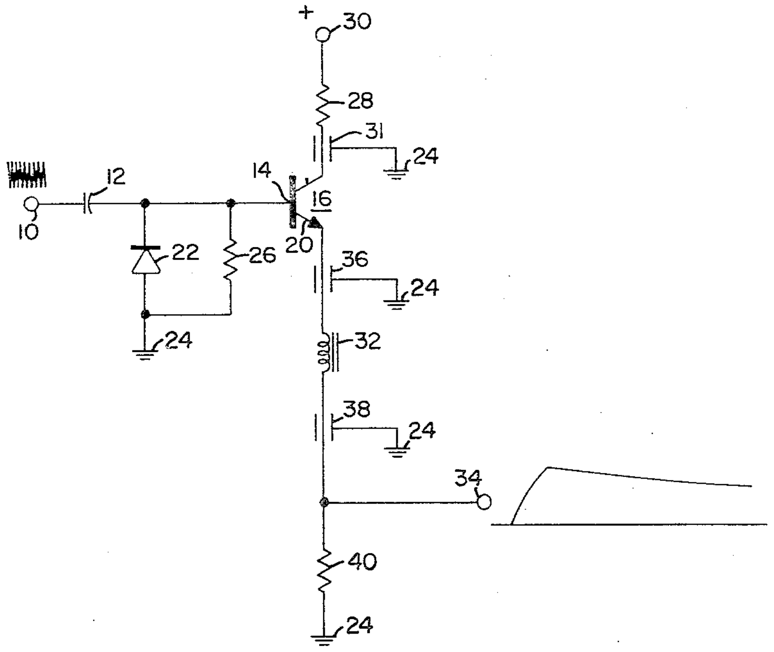
INVENTOR.
PATRICK O. HARVEY
BY Bruce C. Lutz
ATTORNEY United States Patent Office 3,365,585
Patented Jan. 23, 1968

3,365,585

VOLTAGE DOUBLER CIRCUIT INCLUDING TRANSISTOR WHOSE SEMICONDUCTOR JUNCTIONS REPLACE SECOND DIODE AND WHICH CIRCUITS PROVIDES PULSE STRETCHING

Patrick O. Harvey, Minneapolis, Minn., assignor to Honeywell Inc., Minneapolis, Minn., a corporation of Delaware Filed Oct. 21, 1965, Ser. No. 499,384
5 Claims. (Cl. 307—230)

This invention is related generally to electronic circuits and more specifically to an improved voltage doubler circuit. Further, it is related to a circuit which combines a voltage doubler and a pulse stretcher to eliminate some components.

The present invention utilizes the semi-conductor junctions of a transistor to replace the second diode in a voltage doubler circuit. One embodiment of the invention uses the base emitter junction. Utilizing the transistor in this way provides a much lower output impedance at the output of the voltage doubler circuit and allows charging of the output capacitor at a much faster rate than would be possible if a diode were used as in the more normally conceived voltage doubler circuits. In effect, the transistor combines the function of isolation, unilateral current control of the replaced diode, and an impedance changing function. An additional benefit to be discussed later is a power saving in the present connection over the prior art.

When this voltage doubler is combined with a resistor for pulse stretching operation, the total circuit eliminates at least one and in some instances more components. One application of the present invention was in a device where short high frequency bursts of 26 megacycle signals were received and passed to a set of ear phones. However, the burst of energy was so short that it could not be heard by the human ear. To change this short burst of high frequency energy to an audible signal, its frequency was lowered by sending it through a voltage doubler circuit such as shown to rectify it and increase the potential and then allowing it to discharge through a high impedance path and thereby produce a much longer time constant signal or in other words a low frequency signal as compared to the period of the original short burst of high frequency pulses.

It is an object of this invention to provide an improved voltage doubling circuit.

Further objects and advantages of this invention will be apparent from a reading of the specification and appended claims in conjunction with the single drawing which shows one embodiment of the combined voltage doubler and pulse stretcher circuitry.

A capacitor 12 is shown connected between an input terminal 10 and a base or first input means 14 of an NPN transistor generally designated as 16 having a collector or first output means 18 and an emitter or second output means 20. A waveform which is greatly exaggerated in the time scale for purposes of clarity is shown above terminal 10 to illustrate a high frequency burst of pulses. The actual duration of this burst is very short as compared to the signal obtained at the output of this circuit. A diode 22 is connected between a reference potential 24 and base 14. The diode 22 is connected such that the direction of easy current flow is toward base 14 and such that the anode is connected to reference potential 24. In parallel with diode 22 is a resistance element 26. Resistance element 26 is optional but since it was used in one embodiment of the invention for operational stability of prior stages it has been included in this drawing. There will of course be many instances of use of the circuit where resistor 26 is not necessary. A resistance element 28 is connected between collector 18 and a positive power source 30. A feedthrough capacitor 31 couples collector 18 to ground. An inductance 32 is connected between emitter 20 and a signal output terminal 34. Two capacitors 36 and 38 are connected on either side of the inductor 32 and each are connected to reference or ground potential 24. As shown, capacitors 36 and 38 are feedthrough capacitors. These capacitors were used to provide a better overall rejection of 26 megacycle signals riding through the waveform which is present at the emitter 20 of transistor 16. A resistance element 40 is connected between output 34 and reference potential 24.

When a short burst of high frequency pulses is applied to source terminal 10, the negative half cycle of these pulses will act to charge capacitor 12 such that the lead connected to base 14 is positive with respect to the lead connected to input 10. On the positive half cycle of the input signal, the transistor 16 will be forward biased and the charge will flow through transistor 16 to charge capacitor 36 and subsequently capacitor 38. On the subsequent negative half cycle transistor 16 will turn OFF until another positive half cycle appears. However, the frequency of the input signal is so fast as compared to the time constant of the capacitor 36 and 38 in conjunction with resistance element 40 that there will be no appreciable effect on the output signal. This output signal is symbolically shown near terminal 34 as having a fast rise time coupled with a long discharge time. In one embodiment, the rise time was approximately 1 microsecond and the fall time 1,000 microseconds. The inductance 32 helps remove more of the 26 megacycle energy and is not necessary for all embodiments of the invention.

By utilizing the transistor 16 in the voltage doubler circuit, the capacity requirements of capacitor 12 are greatly reduced. In the prior art design, a transistor such as transistor 16 would be used in the emitter follower configuration and connected to terimnal 10. In this configuration, capacitor 12 would have to be of a very large capacity to charge capacitor 36 with enough current in the short time during which the input signal appears. The present configuration on the other hand requires that capacitor 12 be only big enough to energize transistor 16 and the rest of the power comes through the collector emitter junction of transistor 16. Thus, there is not only a saving in components but also the physical size of at least the capacitor 12 is reduced. In addition, there is a savings in power which would normally be wasted in the emitter follower which would have been used in the prior art and the power would have been dissipated to ground.

As shown, the transistor 16 is an NPN transistor but it is to be realized that a PNP transistor or other semi-conductors accomplishing the same purpose will work equally well. Further, while capacitors 36 and 38 have been shown as feedthrough capacitors since better rejection of the 26 megacycle signal is obtained, the circuit will work in some applications of the idea using one or two ordinary capacitors, depending upon the connecting circuitry design, connected between the appropriate leads and reference potential or some other convenient point.

While the short rise time pulse stretching idea has been shown in combination with the voltage doubler, it is to be realized that my invention also is usable merely as a voltage doubler by eliminating resistance means 40 and if desired the inductance 32 along with resistor 26. In this configuration the output will more closely follow the waveform of the high frequency burst of input signal with a low impedance load. However, the output signal will remain at its peak level unless there is a low impedance discharge path so as to allow the output to follow the envelope of the input signal.

While one specific embodiment of the invention has been shown and discussed it is to be realized that other embodiments will be apparent to those skilled in the art, and I wish to be limited only by the scope of the appended claims.

I claim:

1. Apparatus for improving the audibility of a short burst of high frequency signals comprising, in combination:

a source of short bursts of high frequency signals;

semiconductor means including input means and first and second output means;

first capacitive means connected between said source and said input means of said semiconductor means;

reference potential means;

power supplying means connected to said first output means of said semiconductor means for supplying power thereto;

unidirectional means connected between said reference potential means and said input means of said semiconductor means;

second capacitive means capacitively connecting said second output means of said semiconductor means to said reference means;

signal output means for providing low frequency signals as compared to the frequency of said short burst;

high frequency filter means connecting said second output means of said transistor means to said signal output means; and impedance means for providing a high impedance discharge path connected between said signal output means and said reference potential means, said impedance means slowly discharging said second capacitive means to obtain the low frequency signal at said signal output means.

2. Apparatus for improving the audibility of a short burst of high frequency signals comprising, in combination:

a source of short bursts of high frequency signals;

transistor means including input means and first and second output means;

first capacitive means connected between said source and said input means of said transistor means;

reference potential means;

power supplying means connected to said first output means of said transistor means for supplying power thereto;

unidirectional means connected between said reference potential means and said input means of said transistor means;

second capacitive means capacitively connecting said second output means of said transistor means to said reference means;

signal output means for providing low frequency signals as compared to the frequency of said short burst;

means connecting said second output means of said transistor means to said signal output means; and impedance means for providing a high impedance discharge path, connected between said signal output means and said reference potential means, said impedance means slowly discharging said second capacitive means to obtain the low frequency signal.

3. Voltage doubling apparatus comprising, in combination:

a source of signals;

semiconductor means including input means and first and second output means;

first capacitive means connected between said source and said input means of said semiconductor means;

reference potential means;

power supplying means connected to said first output means of said semiconductor means for supplying power thereto;

unidirectional means connected between said reference potential means and said input means of said semiconductor means;

second capacitive means capacitively connecting said second output means of said semiconductor means to said reference means;

signal output means for providing substantially twice the voltage supplied by said source; and means connecting said second output means of said semiconductor means to said signal output means.

4. Apparatus as defined in claim 3 wherein said semiconductor means is a transistor and it is the amplitude of the peak envelope of the signals supplied by said source which is to be increased in amplitude.

5. Voltage doubling apparatus comprising, in combination:

a source of signals;

valve means including input means and first and second output means;

first capacitive means connected between said source and said input means of said valve means;

reference potential means;

power supplying means connected to supply power to said first output means of said valve means;

unidirectional means connected between said reference potential means and said input means of said valve means;

second capacitive means capacitively connecting said second output means of said valves means to said reference means;

signal output means for providing substantially twice the voltage supplied by said source; and means connecting said second output means of said valve means to said signal output means.

No references cited.

ARTHUR GAUSS, *Primary Examiner.*

S. D. MILLER, *Examiner.*